United States Patent
Couleur et al.

(10) Patent No.: US 12,212,237 B2
(45) Date of Patent: Jan. 28, 2025

(54) VOLTAGE REGULATOR WITH PULSE FREQUENCY CONTROL

(71) Applicant: Apple Inc., Cupertino, CA (US)

(72) Inventors: Michael Couleur, Rottach Egern (DE); Bogdan-Eugen Matei, Munich (DE); Ming Sun, Santa Clara, CA (US); Bhanupriya Suresh, Munich (DE)

(73) Assignee: APPLE INC., Cupertino, CA (US)

( * ) Notice: Subject to any disclaimer, the term of this patent is extended or adjusted under 35 U.S.C. 154(b) by 157 days.

(21) Appl. No.: 17/974,787

(22) Filed: Oct. 27, 2022

(65) Prior Publication Data
US 2024/0146190 A1    May 2, 2024

(51) Int. Cl.
*H02M 3/158*    (2006.01)
*H03M 1/10*    (2006.01)

(52) U.S. Cl.
CPC ......... *H02M 3/158* (2013.01); *H03M 1/1014* (2013.01)

(58) Field of Classification Search
CPC .... H02M 3/158; H03M 1/1014; H03M 1/804; H03M 1/808
See application file for complete search history.

(56) References Cited

U.S. PATENT DOCUMENTS

| | | | |
|---|---|---|---|
| 9,843,330 B1* | 12/2017 | Attah | H02M 3/157 |
| 2014/0376281 A1* | 12/2014 | Ohashi | H02M 3/158 |
| | | | 363/25 |
| 2020/0059239 A1* | 2/2020 | Deutscher | H03M 1/164 |

* cited by examiner

*Primary Examiner* — Jue Zhang
*Assistant Examiner* — Afework S Demisse
(74) *Attorney, Agent, or Firm* — Sterne, Kessler, Goldstein & Fox P.L.L.C.

(57) ABSTRACT

The present disclosure describes a system with a first counter circuit, a first converter circuit, a second counter circuit, and a second converter circuit. The first counter circuit is configured to output a first count value based on a comparison between a first reference value and a switched node value of a voltage regulator. The first converter circuit is configured to adjust an activation time of the voltage regulator based on the first count value. The second counter circuit is configured to output a second count value based on a comparison between a second reference value and the switched node value of the voltage regulator. The second converter circuit is configured to adjust an amount of current drawn away from an output of the voltage regulator based on the second count value.

20 Claims, 8 Drawing Sheets

VOLTAGE REGULATOR WITH PULSE FREQUENCY CONTROL

FIELD

This disclosure relates to a voltage regulator and, more particularly, to a voltage regulator with pulse frequency control.

BACKGROUND

Voltage regulators generate a stable output voltage within a range compatible with electronic circuits electrically connected to them. A type of voltage regulator is a DC-to-DC (DC-DC) converter, which converts a source of direct current (DC), such as a battery, from one voltage level to another. There are two types of DC-DC converters: linear and switched. A linear DC-DC converter uses a linear circuit element, such as a resistor, to regulate an output load. A switched DC-DC converter uses a switching circuit element, such as a switching transistor, to provide a pulsed voltage output to the output load. The pulsed voltage output can be smoothed using capacitors, inductors, and other circuit elements.

SUMMARY

Embodiments of the present disclosure include a system with a first counter circuit, a first converter circuit, a second counter circuit, and a second converter circuit. The first counter circuit is configured to output a first count value based on a comparison between a first reference value and a switched node value of a voltage regulator. The first converter circuit is configured to adjust an activation time of the voltage regulator based on the first count value. The second counter circuit is configured to be enabled in response to the first count value reaching a maximum value, where the second counter circuit is configured to output a second count value based on a comparison between a second reference value and the switched node value of the voltage regulator. The second converter circuit is configured to adjust an amount of current drawn away from an output of the voltage regulator based on the second count value.

Embodiments of the present disclosure include a system with a load circuit and a voltage regulator. The voltage regulator is electrically connected to the load circuit and includes an inductance element and a pulse frequency control circuit. The pulse frequency control circuit includes a first counter circuit, a first digital-to-analog converter (DAC) circuit, a second counter circuit, and a second DAC circuit. The first counter circuit is configured to output a first count value based on a comparison between a first frequency reference value and a frequency at which a current flows through the inductance element. The first DAC circuit is configured to adjust an an amount of current flowing through the inductance element based on the first count value. The second counter circuit is configured to output a second count value based on a comparison between a second frequency reference value and the frequency at which the current flows through the inductance element. The second DAC circuit is configured to adjust an amount of current drawn away from an output of the voltage regulator based on the second count value.

Embodiments of the present disclosure include a method for controlling pulse frequency in a voltage regulator. The method includes generating a first count value based on a comparison between a first reference value and a switched node value of a voltage regulator; adjusting an activation time of the voltage regulator based on the first count value; generating a second count value based on a comparison between a second reference value and the switched node value of the voltage regulator; and adjusting an amount of current drawn away from an output of the voltage regulator based on the second count value.

BRIEF DESCRIPTION OF THE DRAWINGS

Aspects of the present disclosure are best understood from the following detailed description when read with the accompanying figures. It is noted that, according to the standard practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
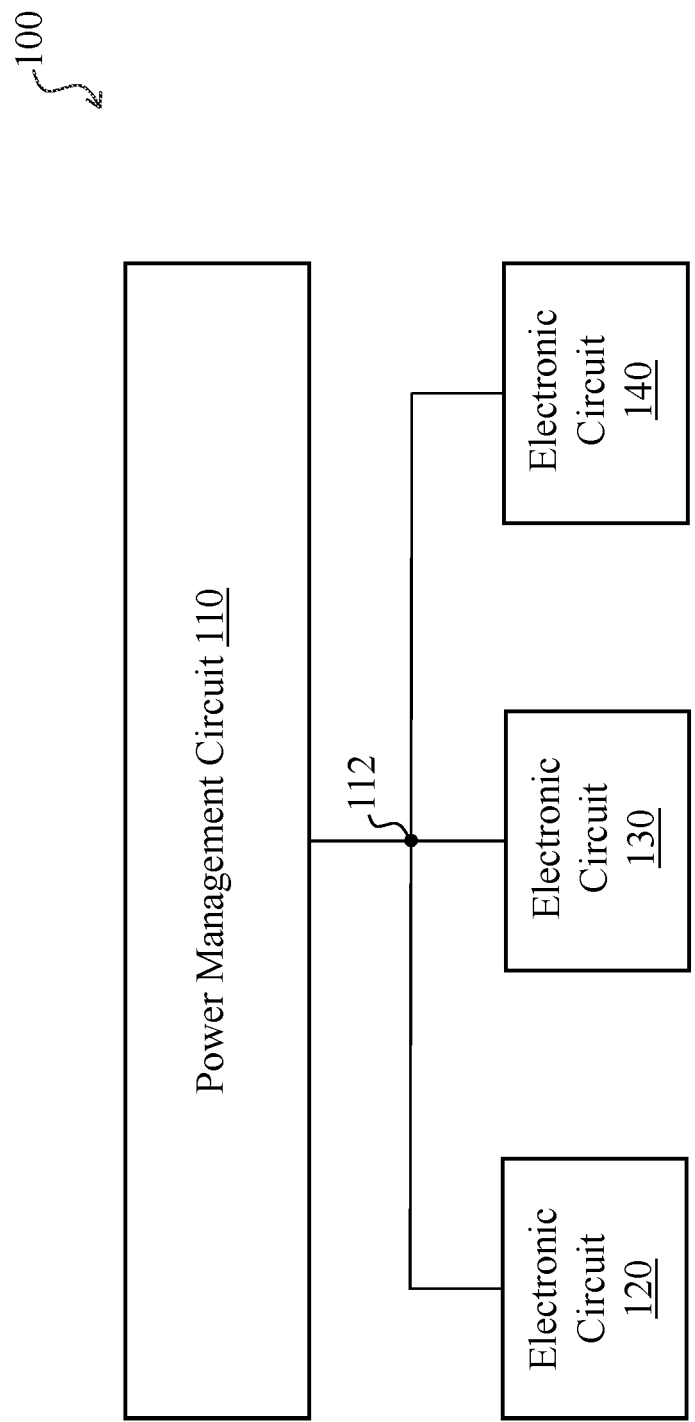
FIG. 1 is an illustration of a block-level representation an electronic system, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

It is noted that references in the specification to "one embodiment," "an embodiment," "an example embodiment," and "exemplary" indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

It is to be understood that the phraseology or terminology herein is for the purpose of description and not of limitation, such that the terminology or phraseology of the present specification is to be interpreted by those skilled in relevant art(s) in light of the teachings herein.

The following disclosure describes aspects of a voltage regulator, such as a switched DC-DC converter, with pulse frequency control. Specifically, the present disclosure describes a voltage regulator configured to provide a voltage (e.g., a power supply voltage) at an output node. The voltage regulator includes a switch controller configured to control a pulse frequency at its output node. Benefits of controlling the pulse frequency include operating the voltage regulator outside an undesirable frequency band, such as an audio frequency band. For example, in operating the voltage regulator outside of the audio frequency band, circuit elements (e.g., smoothing capacitors) in an electronic system implementing the voltage regulator can be prevented from resonating and generating an undesirable audible noise.

FIG. 1 is an illustration of an electronic system 100, according to some embodiments. Electronic system 100 includes a power management circuit 110 and electronic circuits 120, 130, and 140. Power management circuit 110 can convert a source of incoming power (e.g., a battery or other suitable power supply source) to desired voltage/current characteristics of electronic circuits 120, 130, and 140. In some embodiments, power management circuit 110 provides a supply voltage 112 (e.g., a power supply voltage 112) to electronic circuits 120, 130, and 140 and regulates supply voltage 112 as electronic circuits 120, 130, and 140 vary in voltage and/or current consumption (also referred to herein as a "load"). Supply voltage 112 can be at any suitable voltage level for electronic circuits 120, 130, and 140, such as at a power supply voltage (e.g., 1.0 V, 1.2 V, 1.8 V, 2.4 V, 3.3 V, and 5.0 V). Though electronic system 100 shows power management circuit 110 with a single supply voltage 112 electrically connected to electronic circuits 120, 130, and 140, electronic system 100 is not limited to such circuit architecture. For example, power management circuit 110 can provide different supply voltages to one or more of electronic circuits 120, 130, and 140. These other circuit architectures are within the scope of the present disclosure.

Electronic circuits 120, 130, and 140 can be any suitable type of electronic device, such as a processor circuit, a memory circuit, an input/output (I/O) circuit, a peripheral circuit, and combinations thereof. In some embodiments, the processor circuit can include a general-purpose processor to perform computational operations, such as a central processing unit. The processor circuit can also include other types of processing units, such as a graphics processing unit, an application-specific circuit, and a field-programmable gate array circuit. In some embodiments, the memory circuit can include any suitable type of memory, such as Dynamic Random Access Memory, Static Random Access Memory, Read-Only Memory, Electrically Programmable Read-Only Memory, non-volatile memory, and combinations thereof.

In some embodiments, the I/O circuit can coordinate data transfer between one of electronic circuits 120, 130, and 140 (e.g., a processor circuit) and a peripheral circuit. The I/O circuit can implement a version of Universal Serial Bus protocol or IEEE 1394 (Firewire®) protocol, according to some embodiments. Further, in some embodiments, the I/O circuit can perform data processing to implement networking standards, such as an Ethernet (IEEE 802.3) networking standard. Examples of the peripheral circuit can include storage devices (e.g., magnetic or optical media-based storage devices, including hard drives, tape drives, CD drives, DVD drives, and any suitable storage device), audio processing systems, and any suitable type of peripheral circuit, according to some embodiments.

Figure 2:
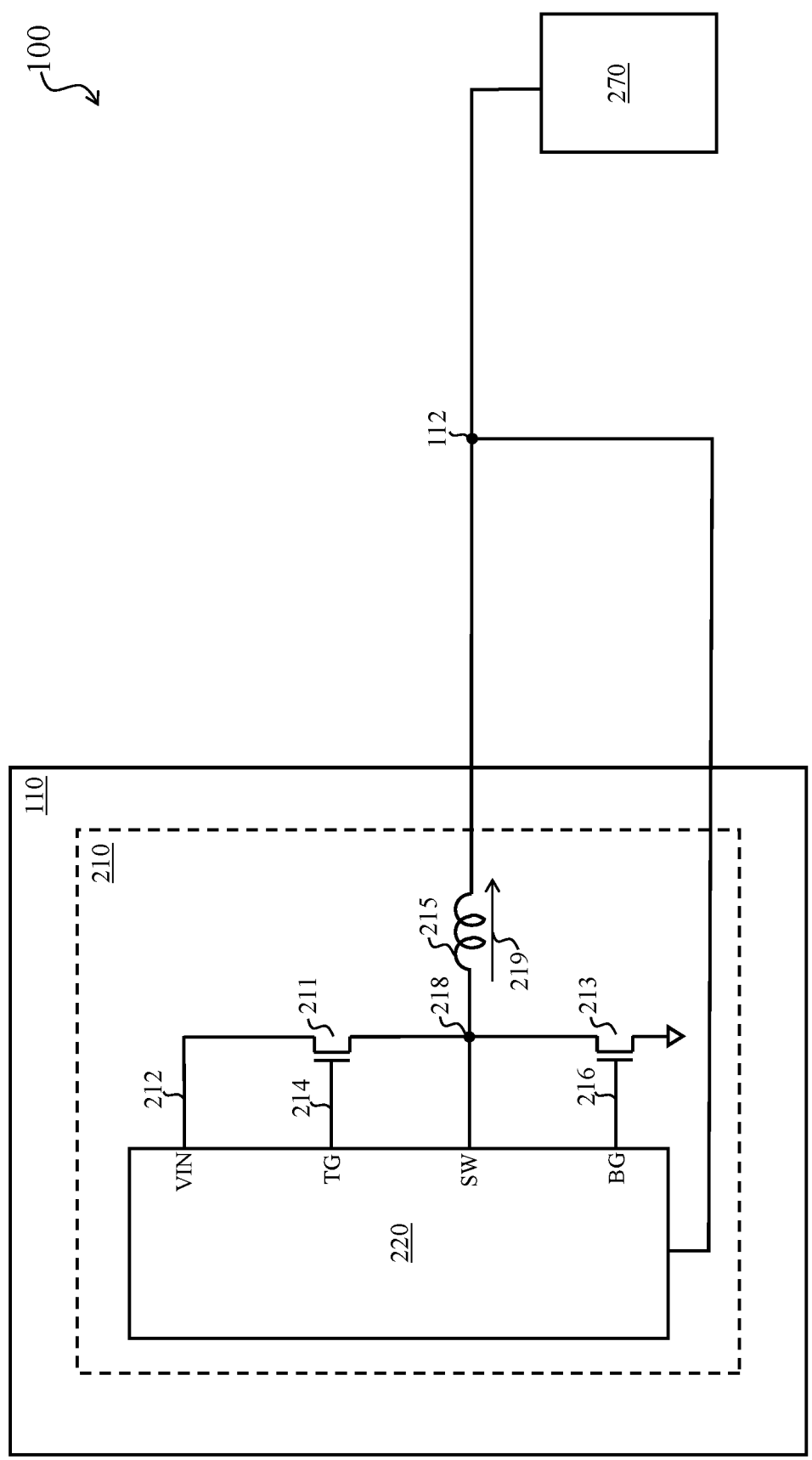
FIG. 2 is an illustration of a circuit-level representation of a power management circuit in an electronic system, according to some embodiments.

FIG. 2 is an illustration of a circuit-level representation of power management circuit 110 in electronic system 100, according to some embodiments. The discussion of elements in FIGS. 1 and 2 with the same annotations applies to one another, unless mentioned otherwise.

Referring to FIG. 2, electronic system 100 includes a load circuit 270, which represents a load of one or more of electronic circuits 120, 130, and 140 of FIG. 1. As described above, electronic circuits 120, 130, and 140 can vary in load (e.g., voltage and/or current consumption). In some embodiments, power management circuit 110 can electrically connect to one or more of electronic circuits 120, 130, and 140 at different times—which can depend on, for example, operation(s) being performed by electronic system 100. Supply voltage 112 can be a power supply voltage to load circuit 270. The voltage level of supply voltage 112 can be at any suitable voltage level for load circuit 270, such as 1.0 V, 1.2 V, 1.8 V, 2.4 V, 3.3 V, and 5.0 V.

Referring to FIG. 2, power management circuit 110 includes a voltage regulator 210 that provides supply voltage 112 at an output node. In some embodiments, voltage regulator 210 can be a switched DC-DC voltage converter, such as a step-up voltage converter (e.g., a boost voltage converter), a step-down voltage converter (e.g., a buck voltage converter), or a step down/up voltage converter (e.g., a buck-boost voltage converter). For example purposes, embodiments of the present disclosure are described within the context of a step-down voltage converter (e.g., a buck voltage converter). The disclosed embodiments are not limited to this type of voltage converter and are applicable to other types of voltage converters, such as a step-up voltage converter (e.g., a boost voltage converter), a step down/up voltage converter (e.g., a buck-boost voltage converter), and other types of voltage converters that have a phase where an inductor ramps up in current and a phase where the inductor ramps down in current.

The switched DC-DC converter can employ a pulse frequency modulation (PFM) mode of operation, where a switching frequency of the switched DC-DC voltage converter can change as a function of a current consumed by load circuit 270 (e.g., positive or negative load current). The PFM mode of operation can be asynchronous, in which switched DC-DC converter pulses are generated when supply voltage 112 falls below a desired output voltage of the switched DC-DC converter (e.g., a regulated voltage of the switched DC-DC converter). As a result, switching losses in the switched DC-DC converter can be reduced, thus improving the converter's power conversion efficiency for load currents.

Voltage regulator 210 includes a switch controller 220, a first switching transistor 211, a second switching transistor 213, and an inductance element 215. Switch controller 220 provides pulses to first switching transistor 211 and to second switching transistor 213 according to a PFM mode of operation, according to some embodiments. For example, in the PFM mode of operation, switch controller 220 can provide pulses to turn on and off first switching transistor 211 and second switching transistor 213 at variable times for a charge cycle—via a signal line 214 and a signal line 216 electrically connected to a gate terminal of first switching transistor 211 and a gate terminal of second switching transistor 213, respectively—based on the load required by load circuit 270. As the load requirement increases, switch controller 220 can turn on and off first switching transistor 211 and second switching transistor 213 (also referred to herein as "switching frequency") at an increased frequency for a charge cycle to pass a voltage VIN from a power supply source (e.g., a battery or other suitable power supply source) via a signal line 212 to inductance element 215, which in turn provides a current 219 to load circuit 270. Conversely, as the load requirement decreases, switch controller 220 decreases the switching frequency of first switching transistor 211 and second switching transistor 213 for a charge cycle.

In some embodiments, inductance element 215 can be an inductor with a first terminal electrically connected to switching transistors 211 and 213 and a second terminal electrically connected to load circuit 270. The first terminal of the inductor is also referred to herein as a "switched node 218" of voltage regulator 210 since this node is switched between voltage levels (e.g., between a voltage level of the power supply source at VIN and ground). The frequency at which switched node 218 transitions between voltage levels can be based on the load required by load circuit 270.

In some embodiments, first switching transistor 211 and second switching transistor 213 can be n-type transistors, p-type transistors, or a combination thereof. In some embodiments, first switching transistor 211 and second switching transistor 213 can be metal-oxide-semiconductor (MOS) transistors, such metal-oxide semiconductor field-effect transistors (MOSFETs), fin field-effect transistors (FinFETs), gate-all-around field-effect transistors (GAAFETs), gallium nitride field effect transistors (GaNFETs), or any other suitable type of transistors.

Switch controller 220 can include a comparator circuit (not shown in FIG. 2) to assist in regulating a desired output voltage of voltage regulator 210 (e.g., a regulated voltage of voltage regulator 210) at supply voltage 112. In some embodiments, the comparator circuit can compare the voltage level of supply voltage 112 (e.g., in which switch controller 220 can receive a feedback signal electrically connected to supply voltage 112)—or a voltage level representative of supply voltage 112—to a voltage regulator reference voltage. If the voltage at supply voltage 112 (or voltage level representative of supply voltage 112) is below the voltage regulator reference voltage—e.g., load circuit 270 draws current away from supply voltage 112—voltage regulator 210 can be enabled and switch controller 220 can adjust the switching frequency to turn on and off first switching transistor 211 and second switching transistor 213 for a charge cycle to increase the voltage level of supply voltage 112 to or above the desired output voltage of voltage regulator 210, according to some embodiments. After supply voltage 112 reaches the desired output voltage of voltage regulator 210, voltage regulator 210 can be disabled (or set in a high-Z state)—e.g., no pulses are received by first switching transistor 211 and second switching transistor 213—until supply voltage 112 falls below the desired output voltage of voltage regulator 210. When voltage regulator 210 is disabled, the gate terminal of first switching transistor 211 (e.g., via signal line 214) can be electrically connected to an output terminal SW of switch controller 220 (which is at ground or 0 V when voltage regulator 210 is disabled) and the gate terminal of second switching transistor 213 (e.g., via signal line 216) can be electrically connected to ground. When disabled, voltage regulator 210 is in a high-Z state until supply voltage 112 falls below the desired output voltage of voltage regulator 210. And, when this supply voltage 112 condition occurs, voltage regulator 210 is enabled and provides pulses to first switching transistor 211 and second switching transistor 213 for a charge cycle to raise the voltage level of supply voltage 112.

Due to the switching characteristics of the switched DC-DC voltage converter, a voltage ripple can appear on supply voltage 112, in which supply voltage 112 can rise to a maximum voltage level and fall to a minimum voltage level. One or more circuit elements, such as a capacitor, can be placed at the output node of voltage regulator 210 (e.g., at supply voltage 112) to smooth the voltage ripple. But, depending on a frequency of pulses generated by voltage regulator 210, the smoothing capacitor—as well as other capacitors and circuit elements in electronic system 100—may resonate and cause an undesirable audio noise.

Figure 3:
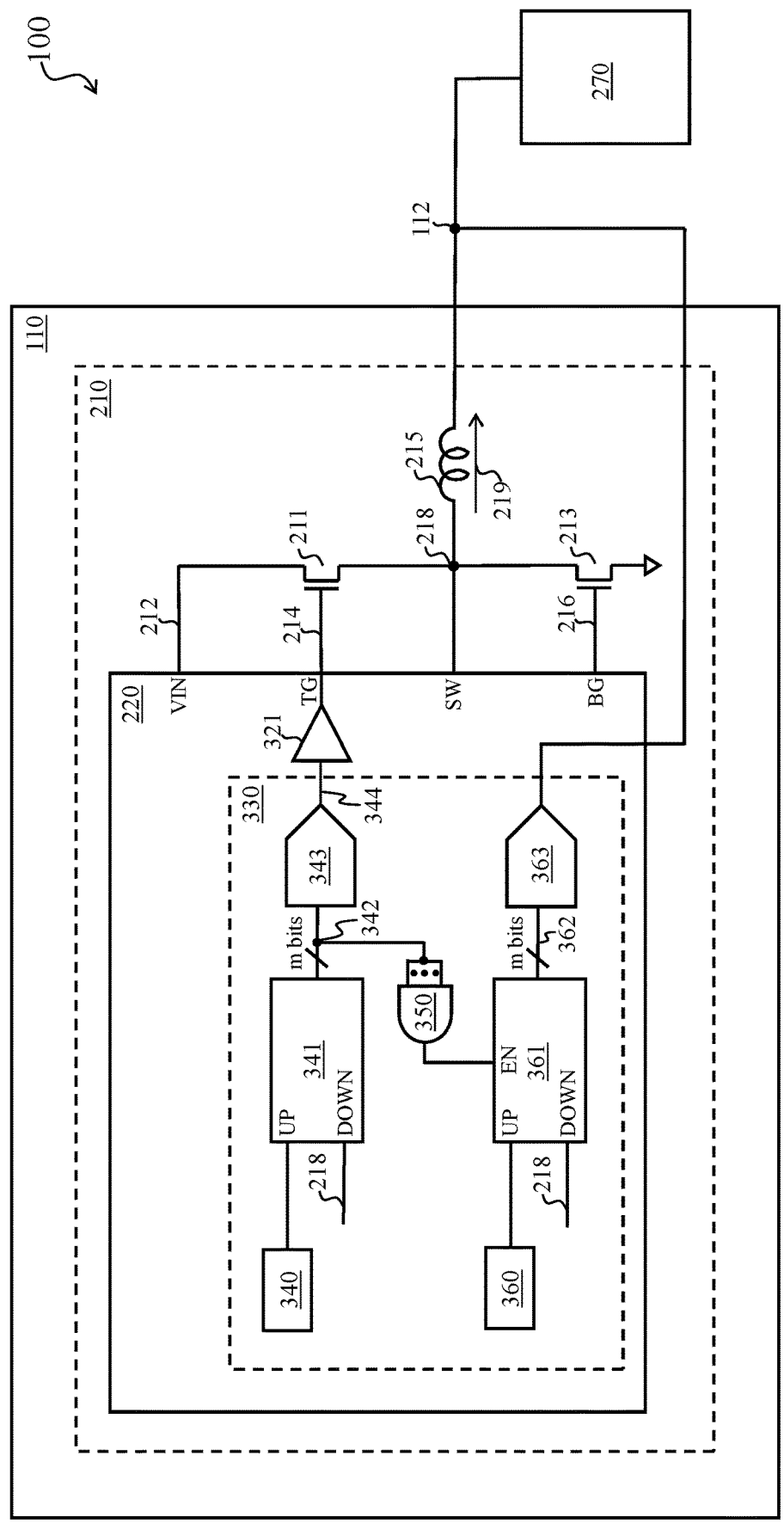
FIG. 3 is an illustration of a circuit-level representation of a voltage regulator in an electronic system, according to some embodiments.

FIG. 3 is an illustration of a circuit-level representation of voltage regulator 210, according to some embodiments. The discussion of elements in FIGS. 1-3 with the same annotations applies to one another, unless mentioned otherwise.

Voltage regulator 210 includes a driver circuit 321 and a pulse frequency control circuit 330. In some embodiments, driver circuit 321 is configured to activate and de-activate (e.g., turn on and off) first switching transistor 211, via signal line 214, during a PFM mode of operation of voltage regulator 210. Though not shown in FIG. 3, another driver circuit can be electrically connected to second switching transistor 213 to activate and de-activate (e.g., turn on and off) second switching transistor 213, via signal line 216, during the PFM mode of operation, according to some embodiments. In some embodiments, each of the driver circuits electrically connected to first switching transistor 211 and second switching transistor 213—via signal line 214 and signal line 216, respectively—can be a gate driver circuit.

Pulse frequency control circuit 330 includes a first reference signal generator 340, a first counter circuit 341, a first converter circuit 343, a logic device 350, a second reference signal generator 360, a second counter circuit 361, and a second converter circuit 363. In some embodiments, pulse frequency control circuit 330 is configured to control a pulse frequency at an output node of voltage regulator 210 (e.g., supply voltage 112) so that voltage regulator 210 operates outside an undesirable frequency band, such as an audio frequency band (e.g., a frequency band between about 20 Hz and about 20 kHz).

First reference signal generator 340 can include an oscillator circuit configured to output a periodic, oscillating signal (e.g., a square wave signal) at a first predetermined frequency, according to some embodiments. The first predetermined frequency can be associated with a desired pulse frequency for voltage regulator 210, according to some embodiments. For example, to maintain the operation of voltage regulator 210 above the audio frequency band (e.g., above about 20 kHz), the first predetermined frequency can be set between about 25 kHz and about 30 kHz. The first predetermined frequency can account for inaccuracies in the oscillator circuit in first reference signal generator 340. The first predetermined frequency can be set to other suitable frequencies.

First counter circuit 341 can include a bidirectional counter circuit—such as an up/down counter—configured to count in either direction based on a control input. First counter circuit 341 can count up to 'm' bits, where 'm' is any suitable integer value (e.g., 2, 3, 4, 5, 6, 7, 8, and so on), according to some embodiments. For example, if 'm' is 5, then first counter circuit 341 can count up to (or have a maximum count value of) $2^5$ or 32. In some embodiments, first counter circuit 341 can receive the output of first reference signal generator 340 at a first input (e.g., an "UP" input) and can receive switched node 218 of voltage regulator 210 at a second input (e.g., a "DOWN" input). As discussed above, switched node 218 transitions between voltage levels (e.g., between a voltage level of the power supply source at VIN and ground) based on the load required by load circuit 270.

First counter circuit 341 compares its first and second inputs to one another and outputs a first count value 342 based on the comparison, according to some embodiments. For example, in response to the frequency of switched node 218 being lower than the first predetermined frequency of first reference signal generator 340, first counter circuit 341 increments first count value 342. Conversely, in response to the frequency of switch node 218 being higher than the first predetermined frequency, first counter circuit 341 decrements first count value 342.

First converter circuit 343 receives first count value 342 from first counter circuit 341 and adjusts an activation time of voltage regulator 210—via a signal line 344—based on first count value 342, according to some embodiments. For an increase in first count value 342, first converter circuit 343 decreases the activation time of voltage regulator 210, which decreases a current peak associated with pulses generated by voltage regulator 210. In turn, the frequency at which voltage regulator 210 generates pulses—the frequency of switched node 218 and thus the frequency at which current flows through inductance element 215—increases to the first predetermined frequency of first reference signal generator 340. Conversely, for a decrease in first count value 342, first converter circuit 343 increases the activation time of voltage regulator 210, which increases the current peak associated with pulses generated by voltage regulator 210. In turn, the frequency at which voltage regulator 210 generates pulses—the frequency of switched node 218 and thus the frequency at which current flows through inductance element 215—decreases to the first predetermined frequency of first reference signal generator 340.

To increase and decrease the activation time of voltage regulator 210, first converter circuit 343 is configured to control driver circuit 321—via signal line 344—to activate and de-activate (e.g., turn on and off) first switching transistor 211. Though not shown in FIG. 3, first converter circuit 343 can also be configured to control another driver circuit electrically connected to second switching transistor 213, in which the other driver circuit activates and de-activates (e.g., turn on and off) second switching transistor 213 via signal line 216. In some embodiments, first converter circuit 343 can be configured to activate or de-activate one or both of the driver circuits electrically connected to first switching transistor 211 and second switching transistor 213.

Figure 4:
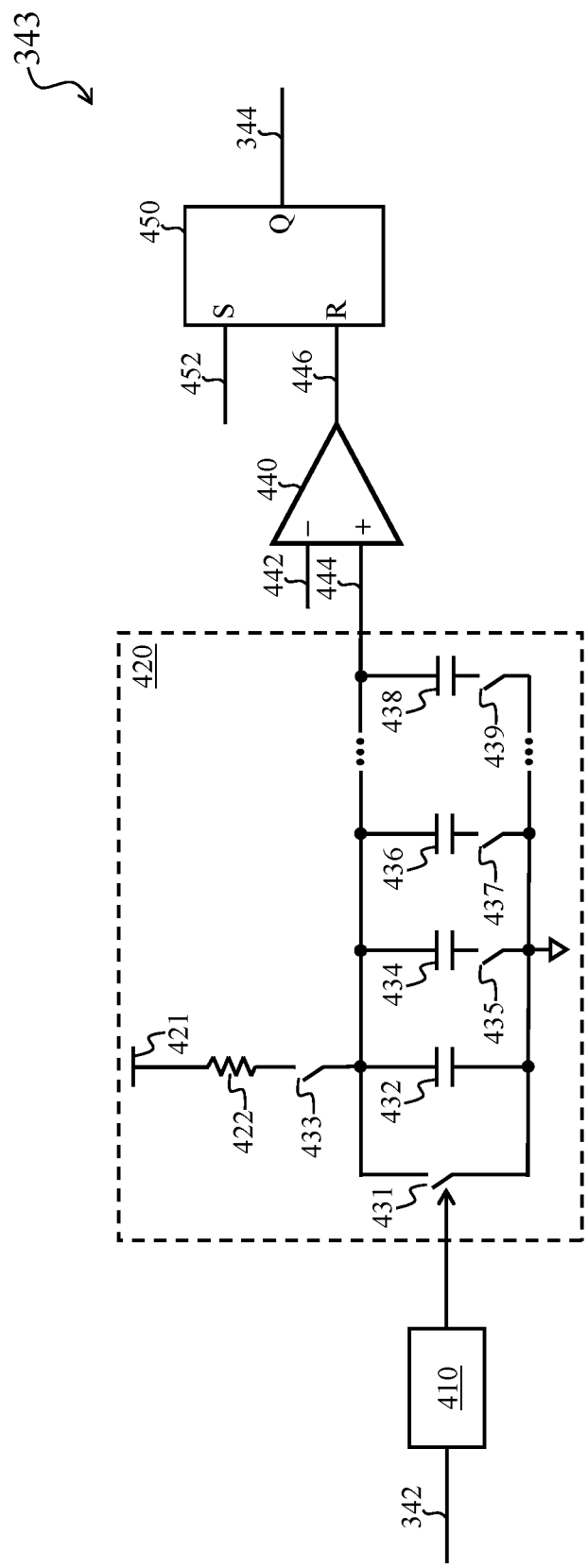
FIG. 4 is an illustration of a circuit-level representation of a digital-to-analog converter in a voltage regulator switch controller, according to some embodiments.

FIG. 4 is an illustration of a circuit-level representation of first converter circuit 343, according to some embodiments. In some embodiments, first converter circuit 343 is a digital-to-analog converter (DAC) circuit and includes a switch control circuit 410, an adjustable delay circuit 420, a comparator circuit 440, and a latch circuit 450.

Switch control circuit 410 is configured to open or close one or more switches 431, 433, 435, 437, and 439 in adjustable delay circuit 420 based on first count value 342, according to some embodiments. Prior to voltage regulator 210 generating pulses, switch control circuit 410 is configured to close switch 431 and open switch 433 to pass ground to an input 444 of comparator circuit 440. When voltage regulator 210 generates pulses (and switch 431 is open and switch 433 is closed), switch control circuit 410 opens or closes one or more switches 435, 437, and 439 to adjust a delay in delivering a power supply voltage 421 to input 444 of comparator circuit 440.

For an increase in first count value 342 and to decrease the activation time of voltage regulator 210, switch control circuit 410 adjusts the number of switches 435, 437, and 439 that are opened/closed to decrease a delay in delivering power supply voltage 421 to input 444 of comparator circuit 440. In turn, an on time of first switching transistor 211 is decreased (or an off time of second switching transistor 213 is increased), thus decreasing a current peak associated with pulses generated by voltage regulator 210. Conversely, for a decrease in first count value 342 and to increase the activation time of voltage regulator 210, switch control circuit 410 adjusts the number of switches 435, 437, and 439 that are opened/closed to increase a delay in delivering a power supply voltage 421 to input 444 of comparator circuit 440. In turn, an on time of first switching transistor 211 is increased (or an off time of second switching transistor 213 is decreased), thus increasing a current peak associated with pulses generated by voltage regulator 210.

Adjustable delay circuit 420 can be an adjustable RC delay circuit that includes power supply voltage 421, a resistance element 422, switches 431, 433, 435, 437, and 439, and capacitance elements 432, 434, 436, and 438, according to some embodiments. Power supply voltage 421 can be at any suitable voltage level, such as 1.0 V, 1.2 V, 1.8 V, 2.4 V, 3.3 V, and 5.0 V. The combination of resistance element 422 and any one or more of selected capacitance elements 432, 434, 436, and 438 (via switched 435, 437, and 439) can form an RC delay element, according to some embodiments. Based on the selected RC delay element, the rate at which power supply voltage 421 is passed to input 444 of comparator circuit 440 can be adjusted.

Resistance element 422 can be a resistor, and capacitance elements 432, 434, 436, and 438 can be capacitors. The values for each of resistance element 422 and capacitance elements 432, 434, 436, and 438 can be any suitable resistance value and capacitance value based on a desired range of selectable RC delay elements. For example, the capacitance value of each of capacitance elements 432, 434, 436, and 438 can be the same value 'C', such that: if switch 435 is selected, then the total capacitance is '2·C' (capacitance elements 432 and 434 are connected in parallel; thus, the RC delay is '2·R·C', where R is the resistance value of resistance element 422); if switches 435 and 437 are selected, then the total capacitance is '3·C' (capacitance elements 432, 434, and 436 are connected in parallel; thus, the RC delay is '3·R·C', where R is the resistance value of resistance element 422); and so forth. Further, the desired range of selectable RC delay elements can be expanded—or finer tuned—with additional selectable capacitor-switch pairs. The number and arrangement of resistors, capacitors, and switches in adjustable delay circuit 420 is not limited to the circuit shown in FIG. 4 and can vary.

In some embodiments, the number of RC delay elements that can be selected in adjustable delay circuit 420 is limited by first count value 342. For example, if 'm' is 5, then first counter circuit 341 can count up to (or have a maximum first count value 342 of) $2^5$ or 32. In turn, the number of RC delay elements that can be selected in adjustable delay circuit 420 is 32.

Comparator circuit 440 is configured to compare input 444 from adjustable delay circuit 420 to a reference voltage 442, according to some embodiments. In some embodiments, reference voltage 442 is at a voltage level less than power supply voltage 421 (e.g., 0.9 V, 1.1 V, 1.7 V, 2.3 V, 3.2 V, and 4.9 V). Comparator circuit 440 can receive input 444 at a '+' input and reference voltage 442 at a '−' input. Prior to voltage regulator 210 generating pulses, input 444 is at ground, in which comparator circuit 440 is configured to output a logic low '0' at an output 446. When voltage generator 210 starts generating pulses (e.g., due to a load required by load circuit 270), the voltage level of input 444 rises above reference voltage 442 after an RC delay set by adjustable delay circuit 420. As a result, output 446 of comparator circuit 440 transitions from a logic low '0' to a logic high '1'.

Latch circuit 450 is configured to receive output 446 from comparator circuit 440 and an activation signal 452. In some embodiments, latch circuit 450 is an SR latch circuit that receives output 446 at an 'R' input and activation signal 452 at an 'S' input. Prior to voltage regulator 210 generating pulses, output 446 at the 'R' input and activation signal 452 at the 'S' input are both at a logic low '0' and an output of the SR latch circuit—via signal line 344—is set to a logic low '0'. When voltage regulator 210 starts generating pulses (e.g., due to a load required by load circuit 270), activation signal 452 is pulsed from a logic low '0' to a logic high '1' and back to a logic low '0', while output 446 is at a logic low '0'. As a result, the output of the SR latch circuit is set to a logic high '1', which starts an activation time of voltage regulator 210 via signal line 344. After an RC delay set by adjustable delay circuit 420 and output 446 of comparator circuit 440 transitions from a logic low '0' to a logic high '1', the output of the SR latch circuit transitions from a logic high '1' to a logic low '0', which ends the activation time of voltage regulator 210 via signal line 344. Thus, based on the RC delay in adjustable delay circuit 420 that can be selected based on first count value 342, the activation time of voltage regulator 210 can be adjusted.

Referring to FIG. 3, first count value 342 generated by first counter circuit 341 can reach a maximum value—e.g., first counter circuit 341 is saturated. For example, if 'm' is 5, then first counter circuit 341 can have a maximum count value of 32. If adjustable delay circuit 420 exhausts all of its selectable RC delay elements (e.g., 32 RC delay elements) and first count value 342 has reached its maximum value (e.g., 32), then this scenario indicates that voltage regulator 210 cannot maintain a pulse frequency operation around the first predetermined frequency of first reference signal generator 340 (e.g., between about 25 kHz and about 30 kHz). For example, even with a minimum RC delay element corresponding to the maximum count value and provided by adjustable delay circuit 420 to adjust an activation time of voltage regulator 210, the pulses generated by voltage regulator 210 can fall below the first predetermined frequency due to an inactivity by load circuit 270 (e.g., minimal or no current consumed by load circuit 270).

In this scenario, switch controller 220 is configured to enable second counter circuit 361 via logic device 350. In some embodiments, logic device 350 can be an m-bit AND logic device configured to receive an m-bit count value from first counter circuit 341. In response to first counter circuit 341 reaching its maximum count value—e.g., all 'm' bits outputted from first counter circuit 341 is at a logic high '1'—the AND logic device can output a logic high '1' and enable second counter circuit 361.

Second counter circuit 361 can include a bidirectional counter circuit—such as an up/down counter—configured to count in either direction based on a control input. Second counter circuit 361 can count up to 'm' bits, where 'm' is any suitable integer value (e.g., 2, 3, 4, 5, 6, 7, 8, and so on), according to some embodiments. For example, if 'm' is 5, then second counter circuit 361 can count up to (or have a maximum count value of) $2^5$ or 32. In some embodiments, second counter circuit 361 can receive an output of second reference signal generator 360 at a first input (e.g., an "UP" input) and can receive switched node 218 of voltage regulator 210 at a second input (e.g., a "DOWN" input).

Second reference signal generator 360 can include an oscillator circuit configured to output a periodic, oscillating signal (e.g., a square wave signal) at a second predetermined frequency, according to some embodiments. The second predetermined frequency can be associated with a desired pulse frequency for voltage regulator, according to some embodiments. In some embodiments, the second predetermined frequency is lower than the first predetermined frequency generated by first reference signal generator 340. For example, to maintain the operation of voltage regulator 210 above the audio frequency band (e.g., above about 20 kHz), the second predetermined frequency can be set between about 21 kHz and about 23 kHz. The second predetermined frequency can account for inaccuracies in the oscillator circuit in second reference signal generator 360. The second predetermined frequency can be set to other suitable frequencies.

Second counter circuit 361 compares its first and second inputs to one another and outputs a second count value 362 based on the comparison, according to some embodiments. For example, in response to the frequency of switched node 218 being lower than the second predetermined frequency of second reference signal generator 360, second counter circuit 361 increments second count value 362. Conversely, in response to the frequency of switch node 218 being higher than the second predetermined frequency, second counter circuit 361 decrements second count value 362.

Second converter circuit 363 receives second count value 362 from second counter circuit 361 and adjusts an amount of current drawn away from an output of voltage regulator 210 based on second count value 362, according to some embodiments. For an increase in second count value 362, second converter circuit 363 increases the amount of current drawn away from the output of voltage regulator 210 (e.g., supply voltage 112), which increases the frequency at which voltage regulator 210 generates pulses to a frequency around the second predetermined frequency of second reference signal generator 360—increases the frequency of switched node 218. Conversely, for a decrease in second count value 362, second converter circuit 363 decreases the amount of current drawn away from the output of voltage regulator 210, which decreases the frequency at which voltage regulator 210 generates pulses to a frequency around the second predetermined frequency of second reference signal generator 360—decreases the frequency of switched node 218.

Figure 5:
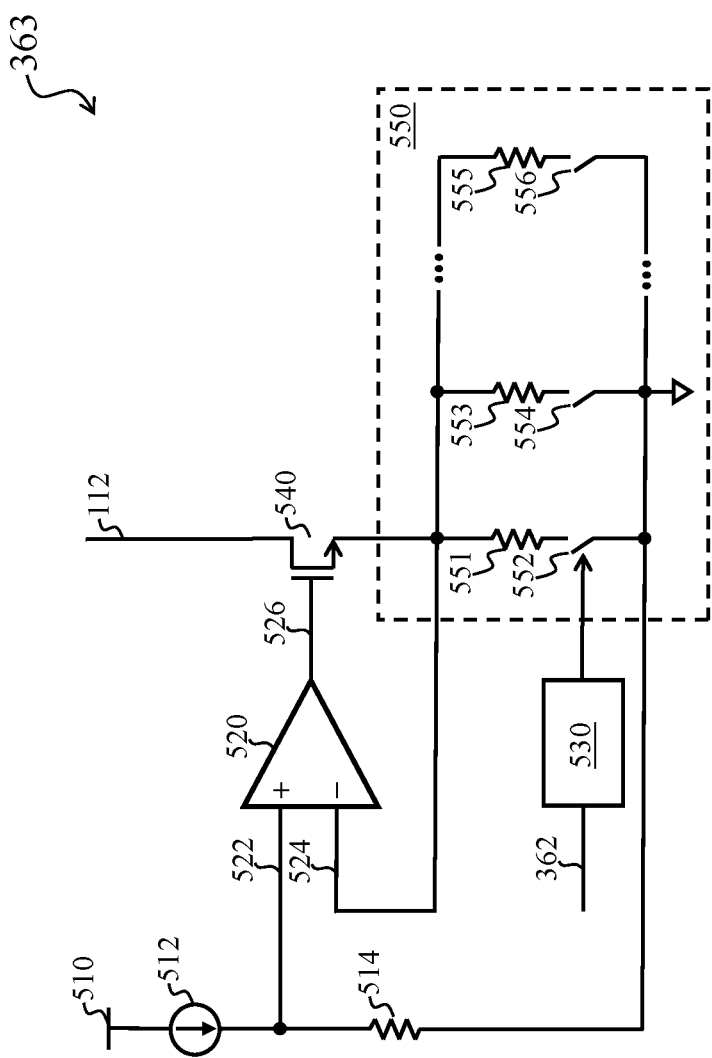
FIG. 5 is an illustration of a circuit-level representation of another digital-to-analog converter in a voltage regulator switch controller, according to some embodiments.

FIG. 5 is an illustration of a circuit-level representation of second converter circuit 363, according to some embodiments. In some embodiments, second converter circuit 363 is a DAC circuit and includes a power supply voltage 510, a current source circuit 512, a resistance element 514, a buffer circuit 520, a switch control circuit 530, a transistor 540, and an adjustable resistor circuit 550. Power supply voltage 510 can be at any suitable voltage level, such as 1.0 V, 1.2 V, 1.8 V, 2.4 V, 3.3 V, and 5.0 V. Current source circuit 512 can be any suitable type of current source, such as a reference current generator with a bandgap voltage reference (e.g., independent of temperature fluctuations in electronic system 100 of FIG. 1). Resistance element 514 can be a resistor with any suitable resistance value. In some embodiments, a current from current source circuit 512 that flows through resistance element 514 creates a voltage at an input 522 of buffer circuit 520.

The arrangement of buffer circuit 520, transistor 540, and adjustable resistor circuit 550 behaves as a current-buffering circuit, where input 522, an input 524, and an output 526 of buffer circuit 520 are at substantially equal voltage levels, according to some embodiments. The current flowing through transistor 540 can be set by adjustable resistor circuit 550. To set the current, a resistance element—one or more of resistance elements 551, 553, and 555—in adjustable resistor circuit 550 can be selected by switch control circuit 530 based on second count value 362.

For example, for an increase in second count value 362 and to increase the activation time of voltage regulator 210, switch control circuit 530 adjusts the number of switches 552, 554, and 556 in adjustable resistor circuit 550 that are opened/closed to increase a resistance, thus increasing the current flowing through transistor 540. Conversely, for a decrease in second count value 362 and to decrease the activation time of voltage regulator 210, switch control circuit 530 adjusts the number of switches 552, 554, and 556 in adjustable resistor circuit 550 that are opened/closed to decrease a resistance, thus decreasing the current flowing through transistor 540. In turn, in addition to the current consumed by load circuit 270, the current generated by adjustable resistor circuit 550 is present at supply voltage 112 so that voltage regulator 210 generates pulses at a frequency around the second predetermined frequency of second reference signal generator 360.

Each of resistance elements 551, 553, and 555 can be a resistor with any suitable resistance value based on a desired range of selectable currents. For example, the resistance value of each of resistance elements 551, 553, and 555 can be the same value 'R', such that: if switch 552 is selected, then the total resistance is 'R' and the total current generated is 'I' (e.g., which is equal to the voltage at input 524 divided by 'R'); if switches 552 and 554 are selected, then the total resistance is 'R/2' and the total current generated is '2·I' (e.g., which is equal to the voltage at input 524 divided by 'R/2'); and so forth. Further, the desired range of selectable currents can be expanded—or finer tuned—with additional selectable resistor-switch pairs. The number and arrangement of resistors and switches in adjustable resistor circuit 550 is not limited to the circuit shown in FIG. 5 and can vary.

Figure 6:
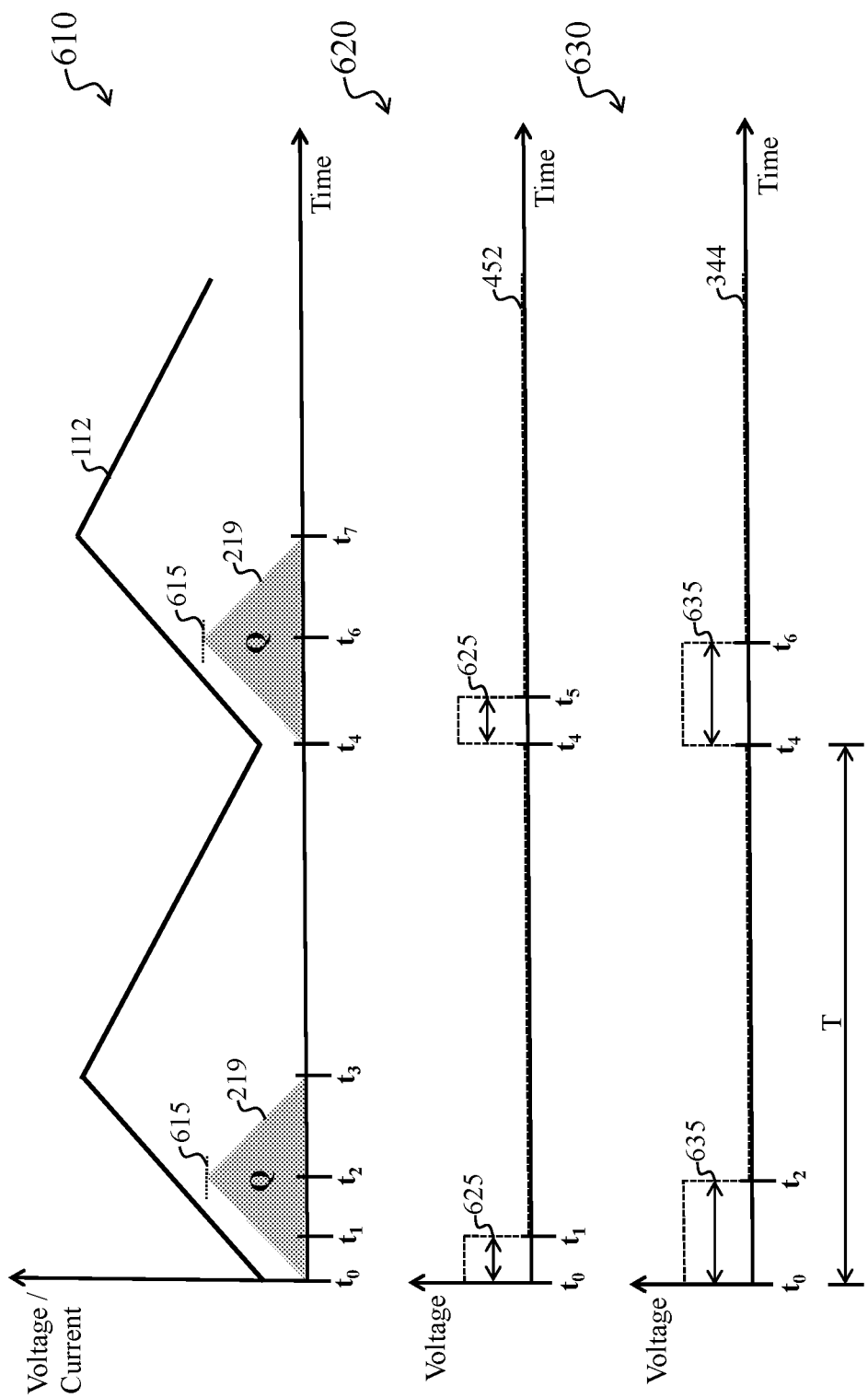
FIG. 6 is an illustration of waveforms showing an operation of a voltage regulator with pulse frequency control, according to some embodiments.

FIG. 6 is an illustration of waveforms 610, 620, and 630 showing an operation of voltage regulator 210 with pulse frequency control, according to some embodiments. Waveform 610 shows an example behavior of supply voltage 112 of FIG. 3 over time and an example behavior of current 219 (e.g., current flowing through inductance element 215 of voltage regulator 210) over time. Waveform 620 shows an example behavior of activation signal 452 in latch circuit 450 of FIG. 4 over time. Waveform 630 shows an example behavior of signal line 344 of FIG. 3—which indicates an activation time of voltage regulator 210—over time. The curvatures in waveforms 610, 620, and 630 are exemplary and for illustration purposes; these waveforms may include different curvatures.

Referring to waveform 610, during a period from time $t_0$ to time $t_3$, voltage regulator 210 performs a charge cycle operation to transfer current 219 (or charge Q) flowing through inductance element 215 to load circuit 270. During the charge cycle operation, current 219 can reach a peak current 615. As a result, supply voltage 112 rises in voltage until time $t_2$ and then falls in voltage thereafter due to a load required by load circuit 270. At time $t_4$, supply voltage 112 falls below a desired output voltage of voltage regulator 210 (e.g., a regulated voltage of a switched DC-DC converter). During a period from time $t_4$ to time $t_7$, voltage regulator 210 performs another charge cycle operation to transfer current 219 (or charge Q) flowing through inductance element 215 to load circuit 270. Similar to the previous charge cycle operation, current 219 can reach peak current 615. At time $t_7$, supply voltage 112 falls in voltage due to a load required by load circuit 270.

Referring to waveform 620, at time $t_0$, activation signal 452 in latch circuit 450 (e.g., an SR latch circuit) transitions from a logic low '0' to a logic high '1' in response to supply voltage 112 falling below the desired output voltage of voltage regulator 210. In some embodiments, activation signal 452 can be at logic high '1' for a predetermined amount of time 625 (e.g., for a period from time $t_0$ to time $t_1$). As a result of activation signal 452 transitioning to logic high '1', an output of latch circuit 450 is set to a logic high '1', which starts an activation time of voltage regulator 210 via signal line 344. Activation signal 452 behaves in a similar manner during a period from time $t_4$ to time is in response to supply voltage 112 falling below the desired output voltage of voltage regulator 210.

Referring to waveform 630, during a period from time $t_0$ to time $t_2$, signal line 344—which indicates an activation time of voltage regulator 210—transitions from a logic low '0' to a logic high '1' for a period of time 635. Similarly, during a period from time $t_4$ to time $t_6$, signal line 344 transitions from logic low '0' to logic high '1' for period of time 635. In some embodiments, period of time 635—the activation time of voltage regulator 210—can be adjusted based on the RC delay in adjustable delay circuit 420 of FIG. 4.

With pulse frequency control circuit 330, described above with respect to FIGS. 3-5, period of time 635 and a frequency of pulses generated by voltage regulator 210 can be controlled. Referring to FIG. 6, the frequency of pulses can be based on a period between subsequent rise times or fall times of signal line 344. For example, the frequency of pulses can be based on a period T between successive rise times of signal line 344 at time $t_0$ and time $t_4$, where the frequency of pulses is the inverse of period T (1/T). The frequency of pulses based on signal line 344 is indicative of the frequency of a signal at switched node 218 because signal line 344 controls the frequency at which switched node 218 transitions between voltage levels via first switching transistor 211 (and/or second switching transistor 213).

In some embodiments, referring to FIG. 3, first counter circuit 341 and first converter circuit 343 maintain the frequency of pulses generated by voltage regulator 210 to be about the first predetermined frequency of first reference signal generator 340 (e.g., between about 25 kHz and about 30 kHz). To control the frequency of pulses generated by voltage regulator 210, for an increase in first count value 342, first converter circuit 343 decreases the activation time (e.g., period of time 635 of FIG. 6) of voltage regulator 210, which decreases a current peak—and the amount of current flowing through inductance element 215—associated with pulses generated by voltage regulator 210 (e.g., peak current 615 of FIG. 6). In turn, the frequency at which voltage regulator 210 generates pulses—the frequency of switched node 218 and thus the frequency at which current flows through inductance element 215—increases to the first predetermined frequency. Conversely, for a decrease in first count value 342, first converter circuit 343 increases the activation time (e.g., period of time 635 of FIG. 6) of voltage regulator 210, which increases the current peak—and the amount of current flowing through inductance element 215—associated with pulses generated by voltage regulator 210 (e.g., peak current 615 of FIG. 6). In turn, the frequency at which voltage regulator 210 generates pulses—the frequency of switched node 218 and thus the frequency at which current flows through inductance element 215—decreases to the first predetermined frequency.

Referring to FIG. 3, when first counter circuit 341 reaches a maximum count value and first converter circuit 343 cannot adjust the activation time of voltage regulator 210 (e.g., period of time 635 of FIG. 6) to operate at a pulse frequency around the first predetermined frequency, second counter circuit 361 is enabled. In some embodiments, second counter circuit 361 and second converter circuit 363 adjust an amount of current drawn away from an output of voltage regulator 210 (e.g., supply voltage 112) so that voltage regulator 210 generates pulses at a frequency around the second predetermined frequency of second reference signal generator 360 (e.g., between about 21 kHz and about 23 kHz). For an increase in second count value 362, second converter circuit 363 increases the amount of current drawn away from the output of voltage regulator 210, which increases the frequency at which voltage regulator 210 generates pulses to a frequency around the second predetermined frequency—increases the frequency of switched node 218. Conversely, for a decrease in second count value 362, second converter circuit 363 decreases the amount of current drawn away from the output of voltage regulator 210, which decreases the frequency at which voltage regulator 210 generates pulses to a frequency around the second predetermined frequency—decreases the frequency of switched node 218.

Figure 7:
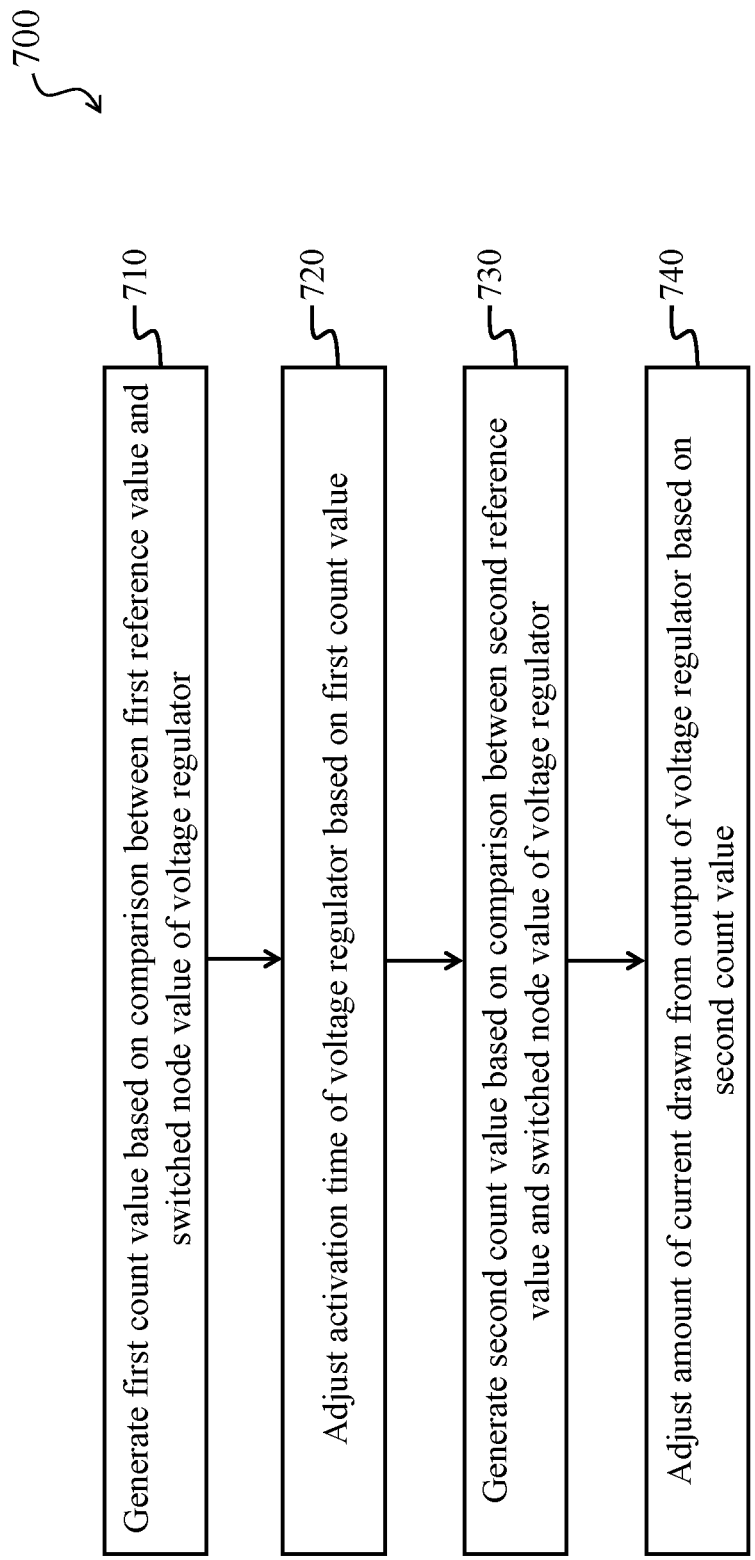
FIG. 7 is an illustration of a method for controlling a pulse frequency in a voltage regulator, according to some embodiments.

FIG. 7 is an illustration of a method 700 for controlling a pulse frequency in a voltage regulator, according to some embodiments. For illustrative purposes, the operations illustrated in method 700 will be described with reference to the electronic system described above with respect to FIGS. 1-5. Other representations of the electronic system are within the scope of the present disclosure. Also, additional operations may be performed between various operations of method 700 and may be omitted merely for clarity and ease of description. The additional operations can be provided before, during, and/or after method 700, in which one or more of these additional operations are briefly described herein. Moreover, not all operations may be needed to perform the disclosure provided herein. Additionally, some of the operations may be performed simultaneously or in a different order than shown in FIG. 7. In some embodiments, one or more other operations may be performed in addition to or in place of the presently-described operations.

Referring to FIG. 7, at operation 710, a first count value is generated based on a comparison between a first reference value and a switched node of a voltage regulator. Referring to FIG. 3, first count value 342 is generated by first counter circuit 341 based on a comparison between the first predetermined frequency of first reference signal generator 340 (e.g., between about 25 kHz and about 30 kHz) and switched node 218 of voltage regulator 210.

Referring to FIG. 7, at operation 720, an activation time of the voltage regulator is adjusted based on the first count value. Referring to FIG. 3, based on first count value 342, first converter circuit 343 can adjust an activation time of voltage regulator 210. For an increase in first count value 342, first converter circuit 343 decreases the activation time of voltage regulator 210, which decreases a current peak associated with pulses generated by voltage regulator 210. In turn, the frequency at which voltage regulator 210 generates pulses—the frequency of switched node 218 and thus the frequency at which current flows through inductance element 215—increases to the first predetermined frequency of first reference signal generator 340. Conversely, for a decrease in first count value 342, first converter circuit 343 increases the activation time of voltage regulator 210, which increases the current peak associated with pulses generated by voltage regulator 210. In turn, the frequency at which voltage regulator 210 generates pulses—the frequency of switched node 218 and thus the frequency at which current flows through inductance element 215—decreases to the first predetermined frequency of first reference signal generator 340. Referring to FIG. 4, an RC delay element from adjustable delay circuit 420 can be selected to adjust the activation time of voltage regulator 210 based on first count value 342.

Referring to FIG. 7, at operation 730, a second count value is generated based on a comparison between a second reference value and the switched node value of the voltage regulator. Referring to FIG. 3, first count value 342 generated by first counter circuit 341 can reach a maximum value—e.g., first counter circuit 341 is saturated. For example, if 'm' is 5, then first counter circuit 341 can have a maximum count value of 32. If adjustable delay circuit 420 of FIG. 4 exhausts all of its selectable RC delay elements (e.g., 32 RC delay elements) and first count value 342 has reached its maximum value (e.g., 32), then this scenario indicates that voltage regulator 210 cannot maintain a pulse frequency operation around the first predetermined frequency of first reference signal generator 340 (e.g., between about 25 kHz and about 30 kHz). For example, even with a minimum RC delay element corresponding to the maximum count value and provided by adjustable delay circuit 420 to adjust an activation time of voltage regulator 210, the pulses generated by voltage regulator 210 can fall below the first predetermined frequency due to an inactivity by load circuit 270 (e.g., minimal or no current consumed by load circuit 270).

In this scenario, switch controller 220 is configured to enable second counter circuit 361 via logic device 350, as described above. Second counter circuit 361 generates second count value 362 based on a comparison between the second predetermined frequency of second reference signal generator 360 (e.g., between about 21 kHz and about 23 kHz) and switched node 218 of voltage regulator 210.

Referring to FIG. 7, at operation 740, an amount of current drawn away from an output of the voltage regulator is adjusted based on the second count value. Referring to FIG. 3, based on second count value 362, second converter circuit 363 adjusts an amount of current drawn away from an output of voltage regulator 210 (e.g., supply voltage 112). Referring to FIG. 5, for an increase in second count value 362 and to increase the activation time of voltage regulator 210, switch control circuit 530 adjusts the number of switches 552, 554, and 556 in adjustable resistor circuit 550 that are opened/closed to increase a resistance, thus increasing the current flowing through transistor 540. Conversely, for a decrease in second count value 362 and to decrease the activation time of voltage regulator 210, switch control circuit 530 adjusts the number of switches 552, 554, and 556 in adjustable resistor circuit 550 that are opened/closed to decrease a resistance, thus decreasing the current flowing through transistor 540. In turn, in addition to the current consumed by load circuit 270, the current generated by adjustable resistor circuit 550 is present at supply voltage 112 so that voltage regulator 210 generates pulses at a frequency around the second predetermined frequency of second reference signal generator 360.

The above disclosure describes aspects of a voltage regulator, such as a switched DC-DC converter, with pulse frequency control. Specifically, the present disclosure describes a voltage regulator configured to provide a voltage (e.g., a power supply voltage) at an output node. The voltage regulator includes a control circuit configured to control a pulse frequency at its output node. The voltage regulator can include any type of voltage converter that has a phase where an inductor ramps up in current and a phase where the inductor ramps down in current, such as a step-up voltage converter (e.g., a boost voltage converter), a step-down voltage converter (e.g., a buck voltage converter), or a step down/up voltage converter (e.g., a buck-boost voltage converter). Benefits of controlling the pulse frequency include operating the voltage regulator outside an undesirable frequency band, such as an audio frequency band. For example, in operating the voltage regulator outside of the audio frequency band, circuit elements (e.g., smoothing capacitors) in an electronic system implementing the voltage regulator can be prevented from resonating and generating an undesirable audible noise.

Figure 8:
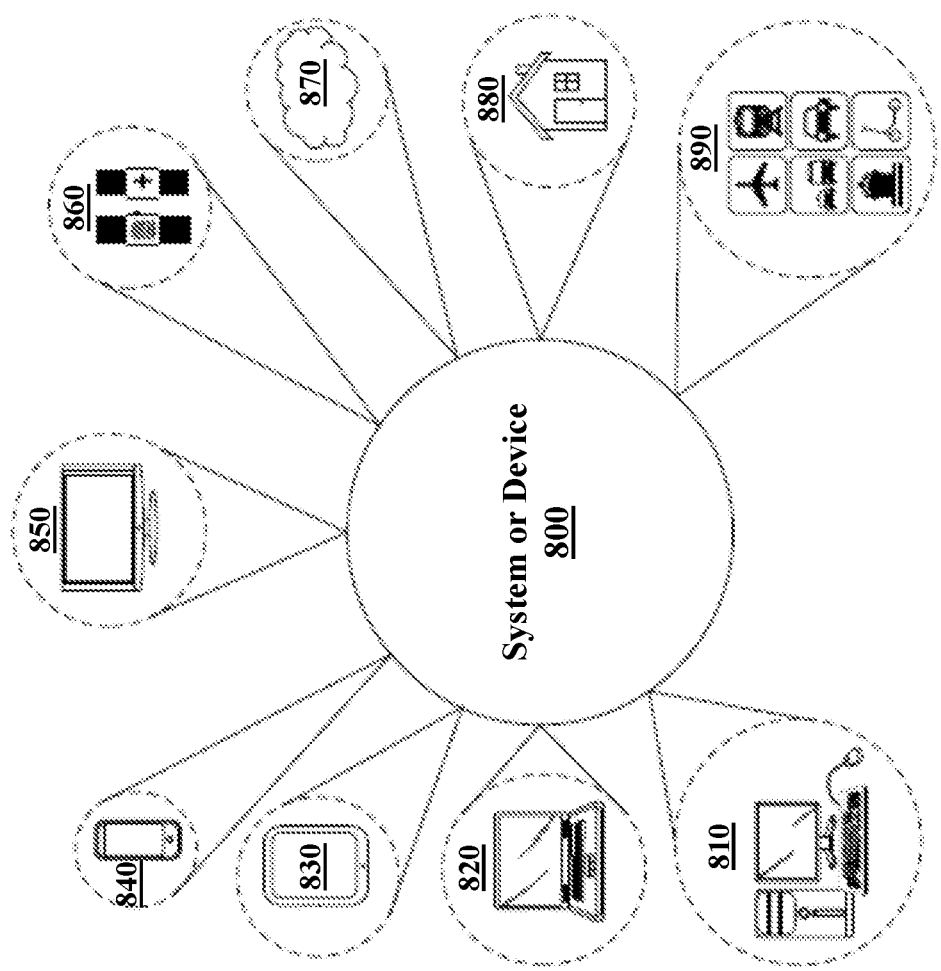
FIG. 8 is an illustration of various exemplary systems or devices that can include the disclosed embodiments.

FIG. 8 is an illustration of exemplary systems or devices that can include the disclosed embodiments. System or device 800 can incorporate one or more of the disclosed embodiments in a wide range of areas. For example, system or device 800 can be implemented in one or more of a desktop computer 810, a laptop computer 820, a tablet computer 830, a cellular or mobile phone 840, and a television 850 (or a set-top box in communication with a television).

Also, system or device 800 can be implemented in a wearable device 860, such as a smartwatch or a health-monitoring device. In some embodiments, the smartwatch can have different functions, such as access to email, cellular service, and calendar functions. Wearable device 860 can also perform health-monitoring functions, such as monitoring a user's vital signs and performing epidemiological functions (e.g., contact tracing and providing communication to an emergency medical service). Wearable device 860 can be worn on a user's neck, implantable in user's body, glasses or a helmet designed to provide computer-generated reality experiences (e.g., augmented and/or virtual reality), any other suitable wearable device, and combinations thereof.

Further, system or device 800 can be implemented in a server computer system, such as a dedicated server or on shared hardware that implements a cloud-based service 870. System or device 800 can be implemented in other electronic devices, such as a home electronic device 880 that includes a refrigerator, a thermostat, a security camera, and other suitable home electronic devices. The interconnection of such devices can be referred to as the "Internet of Things" (IoT). System or device 800 can also be implemented in various modes of transportation 890, such as part of a vehicle's control system, guidance system, and/or entertainment system.

The systems and devices illustrated in FIG. 8 are merely examples and are not intended to limit future applications of the disclosed embodiments. Other example systems and devices that can implement the disclosed embodiments include portable gaming devices, music players, data storage devices, and unmanned aerial vehicles.

It is to be appreciated that the Detailed Description section, and not the Abstract section, is intended to be used to interpret the claims. The Abstract section may set forth one or more but not all possible embodiments of the present disclosure as contemplated by the inventor(s), and thus, are not intended to limit the subjoined claims in any way.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
  a first counter circuit configured to output a first count value based on a comparison between a first reference value and a switched node value of a voltage regulator;
  a first converter circuit configured to adjust an activation time of the voltage regulator based on the first count value;
  a second counter circuit configured to be enabled in response to the first count value reaching a maximum value, wherein the second counter circuit is configured to output a second count value based on a comparison between a second reference value and the switched node value of the voltage regulator; and
  a second converter circuit configured to adjust an amount of current drawn away from an output of the voltage regulator based on the second count value.

2. The system of claim 1, wherein the first reference value is higher than the second reference value.

3. The system of claim 1, wherein the first reference value is at a first frequency higher than an upper limit of an audio band frequency range and the second reference value is at a second frequency between the first frequency and the upper limit of the audio band frequency range.

4. The system of claim 1, wherein the first reference value is a frequency value, and wherein the first counter circuit is configured to:

increment the first count value in response to a frequency associated with the switched node value of the voltage regulator being below the frequency value; and decrement the first count value in response to the frequency associated with the switched node value of the voltage regulator being above the frequency value.

5. The system of claim 1, wherein the first converter circuit comprises an adjustable RC delay circuit configured to adjust the activation time of the voltage regulator.

6. The system of claim 1, wherein the first converter circuit is configured to select a minimum delay element in response to the first count value reaching the maximum value.

7. The system of claim 1, wherein the second reference value is a frequency value, and wherein the second counter circuit is configured to:

increment the second count value in response to a frequency associated with the switched node value of the voltage regulator being below the frequency value; and decrement the second count value in response to the frequency associated with the switched node value of the voltage regulator being above the frequency value.

8. The system of claim 1, wherein the second converter circuit comprises an adjustable resistor circuit configured to adjust an amount of current drawn away from the output of the voltage regulator.

9. A system, comprising:
a load circuit; and
a voltage regulator electrically connected to the load circuit, wherein the voltage regulator comprises:
an inductance element; and
a pulse frequency control circuit, comprising:
a first counter circuit configured to output a first count value based on a comparison between a first frequency reference value and a frequency at which a current flows through the inductance element;
a first digital-to-analog converter (DAC) circuit configured to adjust an amount of the current flowing through the inductance element based on the first count value;
a second counter circuit configured to output a second count value based on a comparison between a second frequency reference value and the frequency at which the current flows through the inductance element; and
a second DAC circuit configured to adjust an amount of current drawn away from an output of the voltage regulator based on the second count value.

10. The system of claim 9, wherein the voltage regulator is a step-up voltage converter, a step-down voltage converter, or a step down/up voltage converter.

11. The system of claim 9, further comprising:
a logic device configured to receive the first count value from the first counter circuit and to enable the second counter circuit in response to the first count value reaching a maximum value.

12. The system of claim 9, further comprising:
a first reference signal generator configured to generate the first frequency reference value; and a second reference signal generator configured to generate the second frequency reference value,
wherein the first frequency reference value is higher than an upper limit of an audio band frequency range and the second frequency reference value is between the first frequency reference value and the upper limit of the audio band frequency range.

13. The system of claim 9, wherein the first DAC circuit comprises:
an adjustable RC delay circuit;
a control circuit configured to select an RC delay element from the adjustable RC delay circuit based on the first count value; and
a latch circuit configured to transition from a first logic state to a second logic state in an amount of time based on the selected RC delay element.

14. The system of claim 9, wherein the second DAC circuit comprises:
an adjustable resistor circuit;
a control circuit configured to select a resistance element from the adjustable resistor circuit based on the second count value; and
a current source and resistor combination configured to provide a voltage to the selected resistance element.

15. A method, comprising:
generating a first count value based on a comparison between a first reference value and a switched node value of a voltage regulator;
adjusting an activation time of the voltage regulator based on the first count value;
generating a second count value based on a comparison between a second reference value and the switched node value of the voltage regulator; and
adjusting an amount of current drawn away from an output of the voltage regulator based on the second count value.

16. The method of claim 15, wherein generating the first count value comprises:
generating a frequency for the first reference value; and
comparing the frequency for the first reference value to a frequency associated with the switched node value of the voltage regulator.

17. The method of claim 15, wherein adjusting the activation time of the voltage regulator comprises selecting a delay element based on the first count value.

18. The method of claim 15, wherein generating the second count value comprises enabling a counter circuit in response to the first count value reaching a maximum value.

19. The method of claim 15, wherein generating the second count value comprises:
generating a frequency for the second reference value; and
comparing the frequency for the second reference value to a frequency associated with the switched node value of the voltage regulator.

20. The method of claim 15, wherein adjusting the amount of current drawn from the output of the voltage regulator comprises selecting a resistance element based on the second count value.

* * * * *